United States Patent [19]

Sato

[11] Patent Number: 5,371,391

[45] Date of Patent: Dec. 6, 1994

[54] MOS SEMICONDUCTOR DEVICE AND METHOD OF FABRICATING THE SAME

[75] Inventor: Yasuo Sato, Sagamihara, Japan

[73] Assignee: Nippon Steel Corporation, Tokyo, Japan

[21] Appl. No.: 992,829

[22] Filed: Dec. 21, 1992

[30] Foreign Application Priority Data

Dec. 20, 1991 [JP] Japan .................................. 3-355792

[51] Int. Cl.$^5$ ...................... H01L 23/00; H01L 29/78
[52] U.S. Cl. ..................................... 257/387; 257/344
[58] Field of Search ............... 257/387, 388, 344, 345, 257/346

[56] References Cited

U.S. PATENT DOCUMENTS

| 4,356,622 | 11/1982 | Widmann | 257/346 |
| 4,951,100 | 8/1990 | Parrillo | 257/344 |
| 5,091,763 | 2/1992 | Sanchez | 257/346 |

FOREIGN PATENT DOCUMENTS

| 63-227059 | 9/1988 | Japan | 257/344 |
| 2-2134 | 1/1990 | Japan | 257/344 |

OTHER PUBLICATIONS

Blum et al, "Sidewall Oxide Structure and Method for Polysilicon Gate . . . " *IBM Tech*, vol. 26, No. 3B, Aug. 83, pp. 1316–1317.

"Reduction of Gate Overlap Capacitance of Inverse-T Transistor" 51th Science of applied Physics Association pp. 575, 26p-G-5.

*Primary Examiner*—Andrew J. James
*Assistant Examiner*—Stephen D. Meier
*Attorney, Agent, or Firm*—Pollock, Vande Sande & Priddy

[57] ABSTRACT

A first gate layer of a first conductor layer is formed on a gate oxide layer and selectively covered with a second gate layer of a second conductor layer. The first and second gate layers are used as a mask and a semiconductor substrate is thermally oxidized to thereby increase a thickness of a portion of the gate oxide layer except the gate layers and cover the second gate layer and the portion having the increased thickness of the gate oxide layer with a third conductor layer. Thereafter, a side wall of an insulating layer is formed on a side portion of the second gate layer and is used as a mask to form a third gate layer. The first, second and third gate layers and the side wall are used as a mask and impurity is introduced into the semiconductor substrate relatively heavily to thereby form a heavily doped impurity layer.

3 Claims, 3 Drawing Sheets

MOS SEMICONDUCTOR DEVICE AND METHOD OF FABRICATING THE SAME

FIELD OF THE INVENTION

The present invention relates to an MOS semiconductor device and a method of fabricating the same and more particularly to an improvement of an inverse T-type transistor.

BACKGROUND OF THE INVENTION

In order to prevent deterioration of hot carrier immunity due to fine fabrication of an element, an inverse T-type transistor has been proposed (for example, IEDM 86, pp. 742-745). The inverse T-type transistor is common with a transistor having an LDD structure in that a source and drain are formed by a dual layer composed of an N− layer and an N+ layer formed in a surface of a P-type silicon (Si) substrate and the N− layer faces a channel region while the inverse T-type transistor is different from the transistor having the LDD structure in that an overlap between a polycrystalline silicon layer constituting a gate electrode and the N− layer is larger.

Such a structure is formed in order to prevent deterioration of the current driving capability by electrons wrapped in a portion above the N− layer of an $S_iO_2$ layer which is a gate oxide layer. However, the inverse T-type transistor has an overlap capacitance of the gate electrode and the drain larger than that of the transistor having the LDD structure and accordingly operation of a circuit becomes slower.

In order to overcome this problem, an improved inverse T-type transistor has been proposed in, for example, "REDUCTION OF GATE OVERLAP CAPACITANCE OF INVERSE-T TRANSISTOR", Collected Papers of 51th Science Lecture Meeting of the Japan Society of Applied Physics Association, pp. 575, 26p-G-5, Autumn 1990. In the improved inverse T-type transistor, since a thickness of a layer of the portion above the N− layer of $S_iO_2$ layer constituting the gate oxide layer is thick, the overlap capacitance of the gate electrode and the drain is smaller as compared with the inverse T-type transistor.

However, the improved inverse T-type transistor has been studied only by a simulation, while its practical device structure and fabricating method are not disclosed.

SUMMARY OF THE INVENTION

It is a first object of the present invention to provide a practical device structure of an improved inverse T-type transistor which is easy to fabricate.

It is a second object of the present invention to provide a method of fabricating an improved inverse T-type transistor with good reproducibility.

In order to achieve these objects, according to the present invention, an MOS semiconductor device including a gate electrode formed on a semiconductor substrate of a first conductivity type through a gate insulating layer comprises a first insulating layer formed on the semiconductor substrate of the first conductivity type to constitute the gate insulating layer, a first gate layer formed on the first insulating layer, a second insulating layer located on the semiconductor substrate of the first conductivity type and adjacent to the first gate insulating layer and having a thickness greater than that of the first gate insulating layer, and a second gate layer formed to cover part of the second insulating layer and the first gate layer. Further, in the present invention, the second gate layer desirably includes a metal layer covering a side wall and an upper surface of the first gate layer and a polycrystalline silicon layer covering a side wall of the metal layer and part of the second insulating layer. It is desirable that the MOS semiconductor device further comprises lightly doped source and drain electrodes of a second conductivity type formed on an active region of the semiconductor substrate corresponding to a lower portion of the polycrystalline silicon layer. Desirably, it further comprises heavily doped source and drain electrodes of the second conductivity type formed on the active region of the semiconductor substrate corresponding to the lower portion of the second insulating layer and contiguous to the lightly doped source and drain electrodes of the second conductivity type. It is desirable to further comprise an $S_iO_2$ layer formed on a side wall and an upper wall of the gate electrode formed of the polycrystalline silicon layer. It is also desirable to further comprise metal wiring electrically connected to upper sides of the highly doped source and drain electrodes of the second conductivity type. The metal layer is preferably made of metal including tungsten.

With the above structure, the present invention can provide a practical device structure of the improved inverse T-type transistor which is easy to fabricate.

Further, according to the present invention, the first gate layer of the first conductor layer is formed on a gate oxide layer on the semiconductor substrate and the first gate layer is selectively covered by the second gate layer of a second conductor layer. The first and second gate layers are used as a mask to dope impurity into the semiconductor substrate relatively lightly to thereby form a lightly doped impurity layer. The first and second gate layers are used as a mask to thermally oxidize the semiconductor substrate to thereby increase a thickness of a portion of the gate oxide layer except for a lower portion of the first and second gate layers. The second gate layer and the portion having the increased thickness of the gate oxide layer are covered with a third conductor layer and a side wall made of insulating layer is formed on a side portion of the second gate layer. The side wall is used as a mask to etch the third conductor layer to thereby form a third gate layer made of the third conductor layer. The first, second and third gate layers and the side wall are used as a mask to dope impurity into the semiconductor substrate relatively heavily to form a heavily doped impurity layer.

With the above structure, according to the present invention, since the thickness of the portion of the gate oxide layer except for the lower portion of the first and second gate layers can be increased in self-alignment manner and the second gate layer prevents oxidation of the first gate layer, the improved inverse T-type transistor can be fabricated with good reproducibility.

DESCRIPTION OF THE PREFERRED EMBODIMENTS

Figure 1:
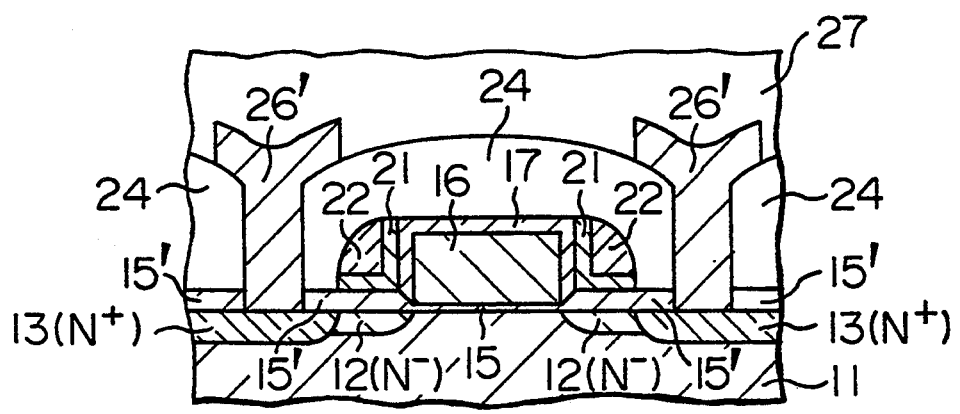
FIG. 1 is an enlarged sectional side view schematically illustrating a structure of an inverse T-type transistor according to an embodiment of the present invention.

The present invention is now described in conjunction with an embodiment with reference to the accompanying drawings.

A first gate layer 16 of polysilicon heavily doped with impurity is formed on a gate oxide layer 15 located on an active region of a semiconductor substrate 11 and the first gate layer 16 is selectively covered with a second gate layers 17 of a conductor layer made of metal having a high melting point such as tungsten. The first and second gate layers 16 and 17 are used as a mask to thermally oxidize the semiconductor substrate 11 to thereby thicken a portion 15' of the gate oxide layer 15 except the gate layers, and the second gate layer 17 and the portion 15' having the increased thickness of the gate oxide layer 15 are covered with a third conductor layer of polycrystalline silicon layer. Then, a side wall 22 of an insulating layer is formed on a side portion of the second gate electrode 17 and the side wall is used as a mask to form a third gate layer 21. The third gate layer 21 and the second gate layer 17 constitute a second gate layer portion which expands an upper layer of the first gate layer 16 to cover it. The first, second and third gate layer 16, 17 and 21 and the side wall 22 are used as a mask to relatively heavily dope impurity 23 into the semiconductor substrate to thereby form source and drain regions having a heavily doped impurity layer 13.

A fabrication method of the improved inverse T-type transistor illustrated in FIG. 1 is now described with reference to FIG. 2.

Figure 2A:
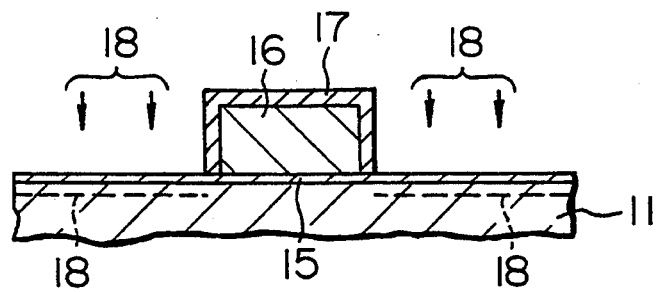
FIGS. 2A to 2I are enlarged sectional side views schematically illustrating an embodiment of a method of fabricating the transistor illustrated in FIG. 1 in order of fabrication processes.

As illustrated in FIG. 2A, a surface of the P-type Si substrate 11 is thermally oxidized to form an $S_iO_2$ layer 15 having a thickness of about 7 to 15 nm constituting a gate oxide layer on a surface of an active region of the Si substrate 11. Further, a polycrystalline line Si layer having a thickness about 100 to 400 nm is deposited on the whole surface of the $S_iO_2$ layer 15 by the CVD method and N-type impurity such as phosphorus (P) is heavily doped onto polycrystalline Si layer 16 by the vapor-phase diffusion method or the like to thereby form a first conductor layer. The first conductor layer is then patterned in the form of line having a width of 0.5 μm or less, for example, by the lithography to thereby form the first gate layer 16 on the $S_iO_2$ layer 15. A tungsten (T) layer 17 having a thickness of about 50 to 200 nm is formed only on the surface of the first gate layer 16 of the polycrystalline Si layer by the selective CVD method to cover the first gate layer 16 with the W layer 17. This W layer 17 constitutes a second gate layer 17. Thereafter, the second gate layer 17 constituted by the W layer and the first gate layer 16 are used as a mask to tightly implant P+ ions 18 into the Si substrate 11 layer.

Figure 2B:
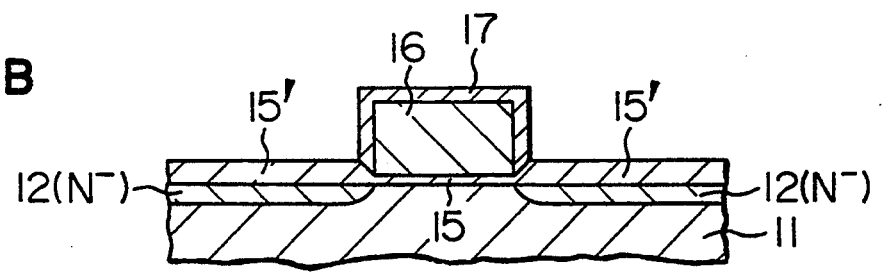

The first gate layer 16 and the second gate layer 17 are then used as a mask to thermally oxidize the Si substrate 11 to thereby increase a thickness of the portion 15' of the $S_iO_2$ layer 15 except for the lower portion of the first and second gate layers 16 and 17 to about 15 to 40 nm as illustrated in FIG. 2B.

Further, the P+ ions 18 implanted into the Si substrate 11 are diffused by heat upon the thermal oxidation to form an N− layer 12. This N− layer 12 constitutes a lightly doped impurity layer of source and drain electrodes.

Figure 2C:
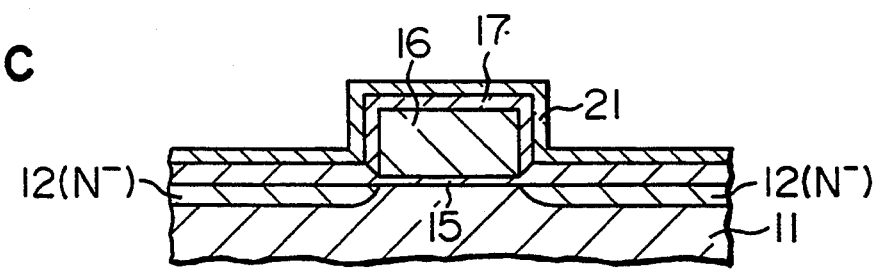
Figure 2D:
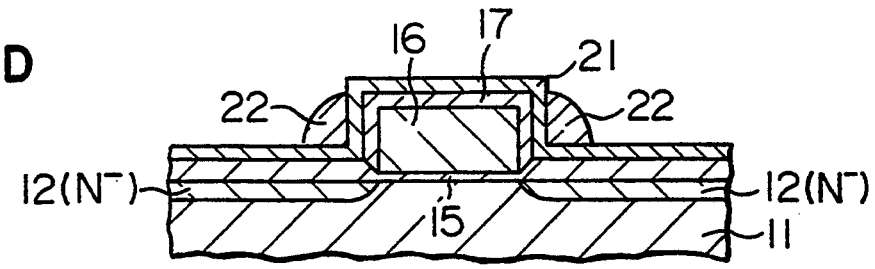

As illustrated in FIG. 2C, a polycrystalline Si layer 21 having a thickness of about 30 to 100 nm is deposited on the whole surface by the CVD method and N-type impurity such as P+ is heavily implanted in the polycrystalline Si layer 21 by the ion implantation method or the like. Thus, an $S_iO_2$ layer 22 is deposited on the whole surface by the CVD method and the whole surface of the $S_iO_2$ layer 22 is etched back to thereby form the side wall of the $S_iO_2$ layer 22 on the side portion of the second gate layer portion 17 as illustrated in FIG. 2D.

Figure 2E:
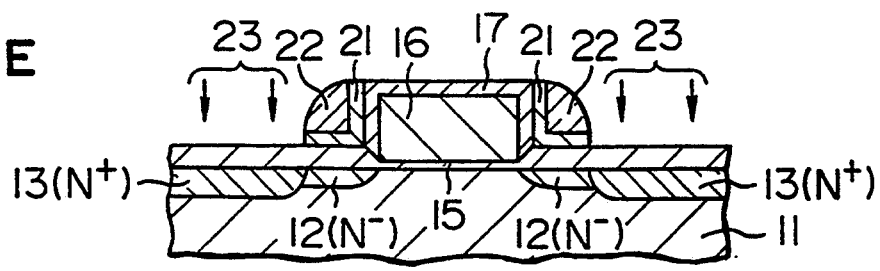

Then, as illustrated in FIG. 2E, the $S_iO_2$ layer 22 is used as a mask to etch the polycrystalline Si layer 21. The polycrystalline Si layer 21 left by the etching constitutes the third gate layer 21. The third gate layer 21 and the second gate layer 17 constitute second gate layer portion which expands an upper layer of the first gate layer 16 to cover it. All of the first to third gate layers 16, 17 and 21 as structured above constitute a gate layer. There after, the first to third gate layers 16, 17 and 21 and the $S_iO_2$ layer 22 are used as a mask to heavily implant arsenic ions (As+) 23 in the Si substrate 11.

The ion implanted As+ 23 is diffused by anneal to form an N+ layer 13. This N+ layer constitutes the heavily doped impurity layer for the source and drain electrode.

With the above processes, a main portion of the desired improved inverse T-type transistor can be fabricated. Thereafter, fabrication of wiring electrodes is performed in accordance with the following processes.

Figure 2F:
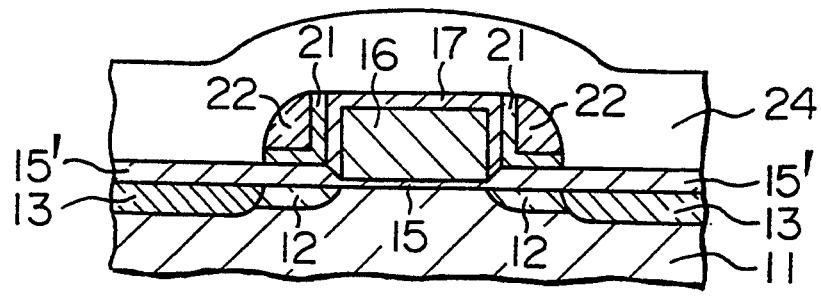
Figure 2G:
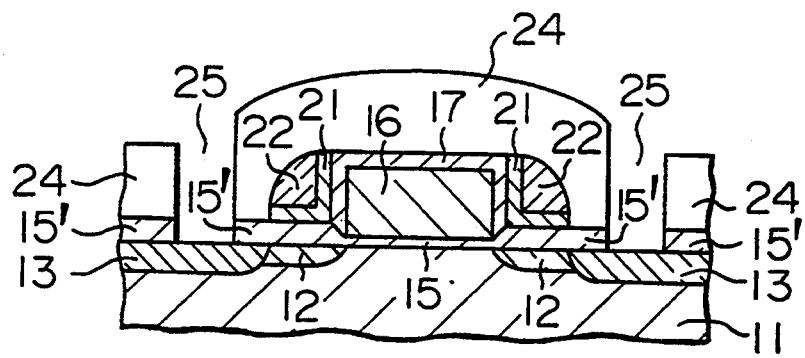
Figure 2H:
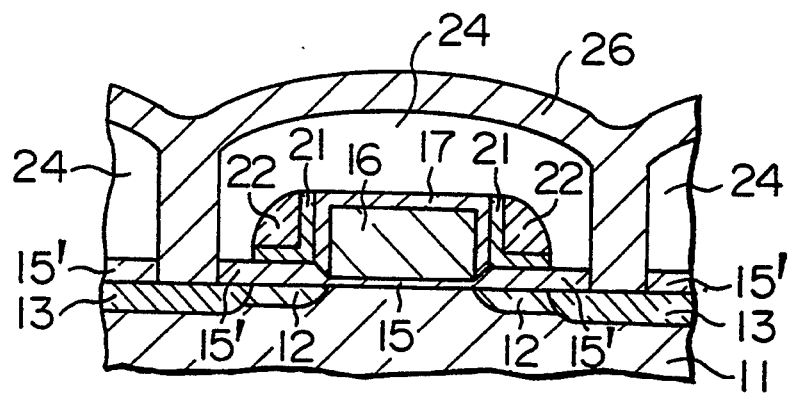
Figure 2I:
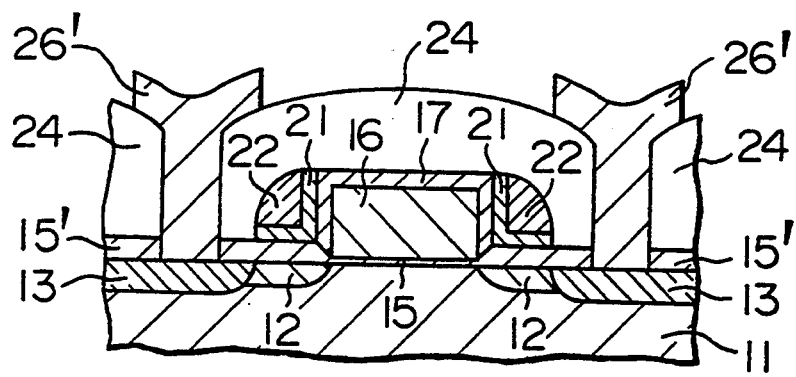

As illustrated in FIG. 2F, an interlayer insulating layer 24 made of oxide layer including, for example, boron and phosphorus and having a thickness of 6000 A, for example, is formed by the reduced pressure CVD method. Then, as illustrated in FIG. 2G, holes or openings 25 are formed in contact formation portions of the interlayer insulating layer 24 by the lithography. Further, as illustrated in FIG. 1H, a metal thin film 26 for wiring made of aluminum mainly is formed by the sputtering method, for example, and further processed to thereby form wiring 26'. Finally, as illustrated in Fig. 1, for example, a protection layer 27 of silicon nitride is formed to fabricate the MOS transistor according to the embodiment of the present invention.

I claim:
1. An MOS semiconductor device comprising:
   a semiconductor substrate of a first conductivity type;
   a first insulating film having a first film thickness and formed on said semiconductor substrate;
   a second insulating film having a second film thickness greater than the first film thickness and formed on said semiconductor substrate continuously with said first insulating film;
   a first gate layer formed on said first insulating film;
   a second gate layer made of a metallic material and formed so as to cover upper and side surfaces of said first gate layer, said second gate layer having an end portion reaching a boundary between said first and second insulating films;
   a third gate layer made of a polycrystalline silicon and formed with an L-shaped cross-section, said third gate layer having a first portion of said L-shaped cross-section formed on the second insulating film and a second portion formed on a side surface of the second gate layer;
   a sidewall of insulating film covering the first and second portions of said third gate layer;
   a first diffusion layer of a low concentration formed in said semiconductor substrate at a first region located under a first portion of the second insulating film closer to the first insulating film; and a second diffusion layer of high concentration formed in said semiconductor substrate at a second region under a second portion of the second insulating film adjacent to said first portion thereof and further from the first insulating film.

2. A MOS semiconductor device according to claim 1, further comprising a metal wiring extending through a hole penetrating the second insulating film to reach the second diffusion layer.

3. A MOS semiconductor device according to claim 1, wherein said second gate layer is made of a material including tungsten.

* * * * *